(12) United States Patent
Caimi et al.

(10) Patent No.: US 10,529,562 B2
(45) Date of Patent: Jan. 7, 2020

(54) FABRICATION OF COMPOUND SEMICONDUCTOR STRUCTURES

(71) Applicant: International Business Machines Corporation, Armonk, NY (US)

(72) Inventors: Daniele Caimi, Besenbueren (CH); Lukas Czornomaz, Zurich (CH); Jean Fompeyrine, Waedenswil (CH); Emanuele Uccelli, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/371,030

(22) Filed: Mar. 31, 2019

(65) Prior Publication Data
US 2019/0228965 A1    Jul. 25, 2019

Related U.S. Application Data

(63) Continuation of application No. 15/166,825, filed on May 27, 2016, now Pat. No. 10,249,492.

(51) Int. Cl.
*H01L 21/02* (2006.01)

(52) U.S. Cl.
CPC .. *H01L 21/02546* (2013.01); *H01L 21/02381* (2013.01); *H01L 21/02455* (2013.01);
(Continued)

(58) Field of Classification Search
CPC ........... H01L 21/02647; H01L 21/2065; H01L 21/02636–02653; H01L 21/02502;
(Continued)

(56) References Cited

U.S. PATENT DOCUMENTS

| 4,948,456 A | 8/1990 | Schubert |
| 4,999,314 A | 3/1991 | Pribat |

(Continued)

FOREIGN PATENT DOCUMENTS

JP    2013535090    9/2013

OTHER PUBLICATIONS

Allon I. Hochbaum et al. Controlled Growth of Si Nanowire Arrays for Device Integration. Nano Lett., vol. 5, No. 3, 2005 American Chemical Society Published on Web Jan. 26, 2005. pp 457-460.
(Continued)

*Primary Examiner* — Eric A. Ward
(74) *Attorney, Agent, or Firm* — Daniel Morris; Otterstedt, Wallace & Kammer, LLP.

(57) ABSTRACT

A semiconductor substrate, comprising a first semiconductor material, is provided and an insulating layer is formed thereon; an opening is formed in the insulating layer. Thereby, a seed surface of the substrate is exposed. The opening has sidewalls and a bottom and the bottom corresponds to the seed surface of the substrate. A cavity structure is formed above the insulating layer, including the opening and a lateral growth channel extending laterally over the substrate. A matching array is grown on the seed surface of the substrate, including at least a first semiconductor matching structure comprising a second semiconductor material and a second semiconductor matching structure comprising a third semiconductor material. The compound semiconductor structure comprising a fourth semiconductor material is grown on a seed surface of the second matching structure. The first through fourth semiconductor materials are different from each other. Corresponding semiconductor structures are also included.

2 Claims, 13 Drawing Sheets

(52) U.S. Cl.
CPC .. *H01L 21/02502* (2013.01); *H01L 21/02639* (2013.01); *H01L 21/02645* (2013.01)

(58) Field of Classification Search
CPC ......... H01L 21/02546; H01L 21/02381; H01L 21/02516; H01L 21/02694; H01L 29/20; H01L 29/32; H01L 29/66522; H01L 29/66795; H01L 29/7851; H01L 21/02455; H01L 21/02639–02645

See application file for complete search history.

(56) References Cited

U.S. PATENT DOCUMENTS

| | | | |
|---|---|---|---|
| 5,360,754 | A | 11/1994 | Pribat |
| 6,500,257 | B1 | 12/2002 | Wang |
| 6,831,350 | B1 | 12/2004 | Liu |
| 7,608,491 | B2 | 10/2009 | Clavelier |
| 8,084,337 | B2 | 12/2011 | Samuelson |
| 8,143,646 | B2 | 3/2012 | Hudait |
| 8,173,551 | B2 | 5/2012 | Bai |
| 8,274,097 | B2 | 9/2012 | Cheng |
| 8,384,196 | B2 | 2/2013 | Hydrick |
| 8,686,472 | B2 | 4/2014 | Hata |
| 8,766,318 | B2 | 7/2014 | Hata |
| 8,916,445 | B1 | 12/2014 | Leobandung |
| 9,171,971 | B2 * | 10/2015 | Ellis-Monaghan ......... H01L 31/0203 |
| 9,368,492 | B2 | 6/2016 | Cheng |
| 9,391,140 | B2 | 7/2016 | Qi |
| 9,735,010 | B1 | 8/2017 | Caimi |
| 9,947,591 | B2 | 4/2018 | Merckling |
| 10,249,492 | B2 | 4/2019 | Caimi |
| 2006/0131606 | A1 | 6/2006 | Cheng |
| 2010/0261339 | A1 | 10/2010 | Wunnicke |
| 2011/0086491 | A1 | 4/2011 | Ko |
| 2011/0204378 | A1 | 8/2011 | Su |
| 2011/0221039 | A1 | 9/2011 | Singh |
| 2011/0253982 | A1 | 10/2011 | Wang |
| 2011/0306179 | A1 | 12/2011 | Wann |
| 2012/0025195 | A1 | 2/2012 | McComber |
| 2014/0091360 | A1 | 4/2014 | Pillarisetty |
| 2015/0102454 | A1 | 4/2015 | Cheng |
| 2016/0027636 | A1 | 1/2016 | Han |
| 2016/0181099 | A1 | 6/2016 | Mukherjee |
| 2017/0117138 | A1 | 4/2017 | Xiao |
| 2017/0345656 | A1 | 11/2017 | Caimi |

OTHER PUBLICATIONS

Cantoro et al. Heteroepitaxy of iii-v compound semiconductors on silicon for logic applications: selective area epitaxy in shallow trench isolation structures vs. direct epitaxy mediated by strain relaxed buffers. ECS Trans. 2013 vol. 50, Issue 9, pp. 349-355.

Semiconductor Today, Compounds & Advanced Silicon, Kyoung Jin Choi et al. First wafer-scale heteroepitaxial growth of iii-v nanowires on silicon, Jun. 11, 2013. pp. 1-3.

Schubert et al. Confined lateral selective epitaxial growth of silicon for device fabrication. IEEE Electron Device Letters, vol. 11, Issue 5, pp. 181-183 May 1990 Abstract Only, Abstract pp. 1-2.

Nguyen et al., Selective epitaxial growth of III-V semiconductor heterostructures on Si substrates for logic applications. ECS Transactions 33(6) 2010 pp. 933-939.

Shin et al., Wafer-Scale Production of Uniform InAsyP1y Nanowire Array on Silicon for Heterogeneous Integration, ACS Nano vol. 7, No. 6, pp. 5463-5471, 2013.

Caimi et al., published U.S. Appl. No. 15/166,645 filed May 27, 2016, Fabrication of Semiconductor Fin Structures, pp. 1-30 plus 18 sheets drawings.

Cantero et al. Heteroepitaxy of iii-v compound semiconductors on silicon for logic applications: selective area epitaxy in shallow trench isolation structures vs. direct epitaxy mediated by strain relaxed buffers. ECS Trans. 2012 1vol. 50, Issue 9, pp. 349-355 complete paper.

Schubert, et al. Confined Lateral Selective Epitaxial Growth of Silicon for Device Fabrication. IEEE Electron Device Letters (vol. 11, Issue: 5). pp. 181-183 May 1990 complete paper.

Caimi et al., published U.S. Appl. No. 15/166,825 filed May 27, 2016, Fabrication of Compound Semiconductor Structures, pp. 1-32 plus 13 sheets drawings.

Caimi et al., published U.S. Appl. No. 15/650,863 filed Jul. 15, 2017, Fabrication of Semiconductor Fin Structures, pp. 1-31 plus 18 sheets drawings.

Paul J. Otterstedt, List of IBM Patents or Patent Applications Treated As Related, Apr. 11, 2019, pp. 1-2.

* cited by examiner

Top view
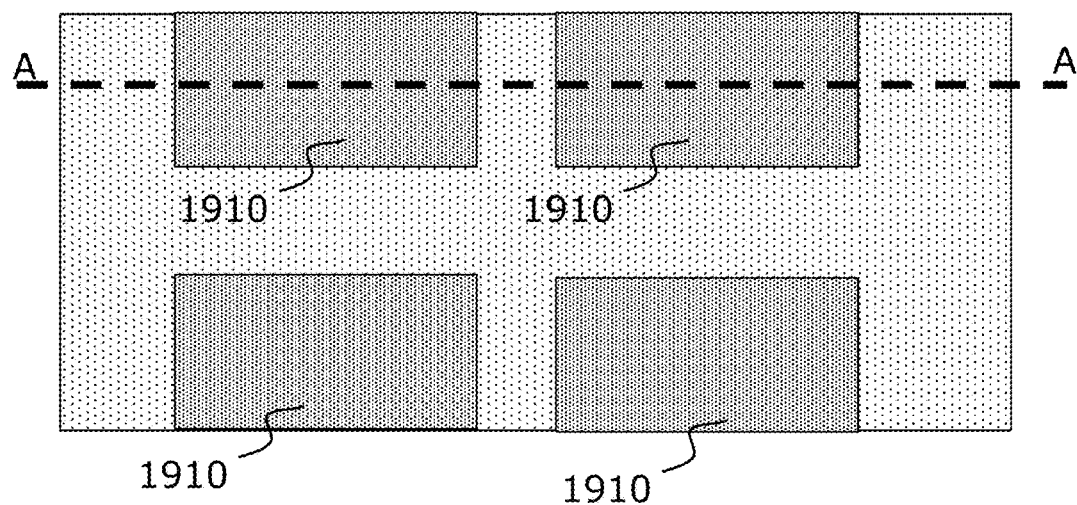
FIG. 19    1900
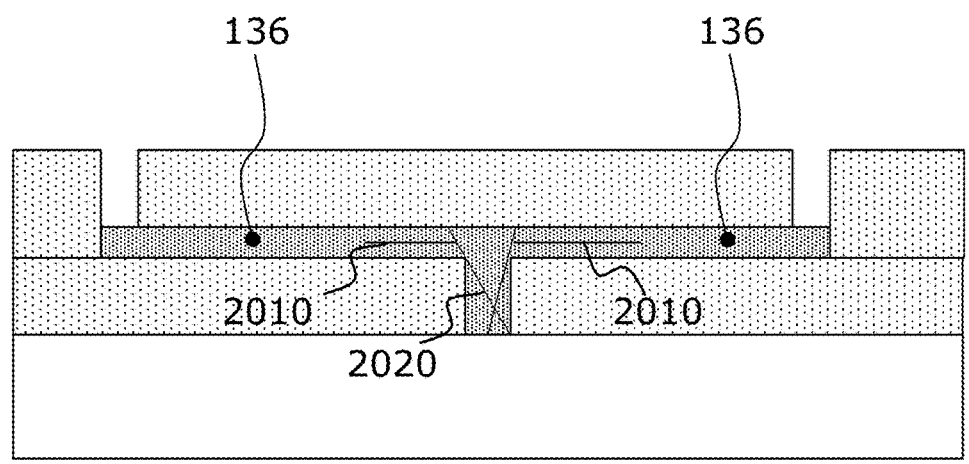
FIG. 20    2000

Top view

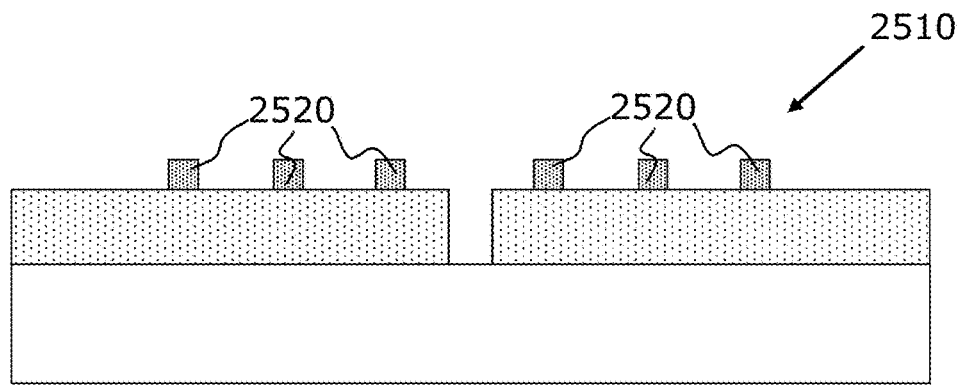
FIG. 25    2500
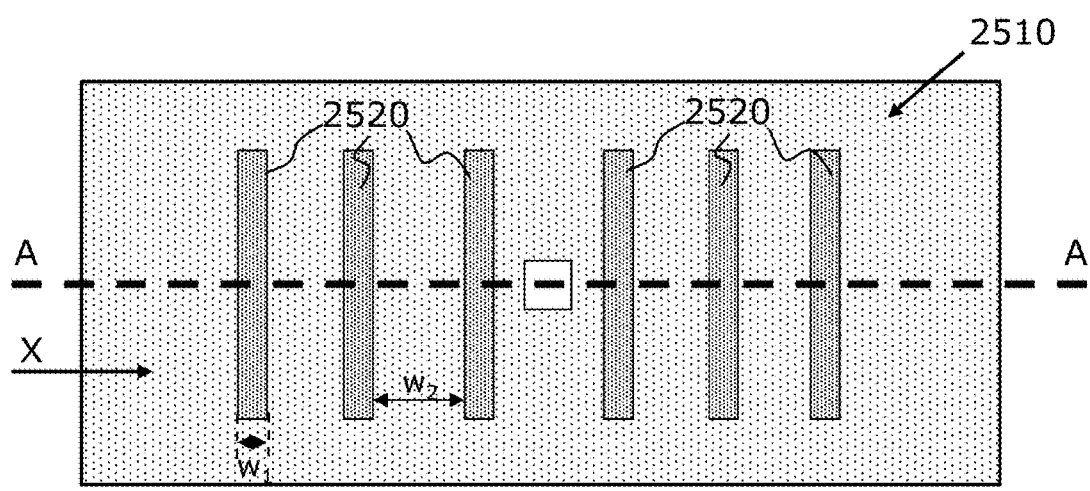
FIG. 26    2600

FABRICATION OF COMPOUND SEMICONDUCTOR STRUCTURES

CROSS-REFERENCE TO RELATED APPLICATIONS

This application is a continuation of U.S. patent application Ser. No. 15/166,825 filed 27 May 2016, the complete disclosure of which is expressly incorporated herein by reference in its entirety for all purposes.

BACKGROUND

Embodiments of the invention relate generally to the fabrication of semiconductor structures and more particularly to the fabrication of compound semiconductor nanostructures and microstructures on substrates having an insulating layer.

Silicon is the basic material for present solid-state electronics, and processing techniques have been evolved for decades. Hence, most electronic integrated circuit devices are based on silicon.

However, III-V compound semiconductors, and especially InGaAs, are being considered as a potential alternative for replacing strained Si in the channel of future nFETs due to their remarkable electron mobility. Moreover, some III-V compound semiconductors present several advantages for opto-electronics applications when compared to Si.

A monolithic integration of compound semiconductors on silicon wafers is desirable and has extensively been investigated in the past. Several problems need to be overcome when compound semiconductors and conventional silicon technologies are be combined. First, there is a large lattice mismatch between a crystalline silicon substrate and compound semiconductor crystals. Further, there is a thermal expansion coefficient mismatch between the (silicon) wafer material and the active compound semiconductor material. Additionally, a structural mismatch between diamond-like structures and zincblende structures may occur. It is an overall goal to achieve high crystalline quality over various monolithic layers for compound semiconductor on a foreign substrate such as silicon.

In an effort to achieve high crystalline quality in crystalline material layers that show a lattice mismatch, several methods have been developed. For example, direct epitaxy of blanket layers allow for a gradual transition from one lattice parameter to the next. However, relatively thick transition layers are needed to reduce the defect density considerably.

Techniques to combine compound semiconductor materials with conventional silicon wafers include bonding techniques. In direct wafer bonding, a compound hetero structure is fabricated on a donor wafer wherein the donor wafer material is eliminated after bonding with the conventional silicon wafer. This makes the bonding technology relatively expensive. Further, bonding is limited to the size of costly compound substrate wafers.

Another approach for combining lattice-mismatched materials such as compound semiconductors with silicon substrates is the aspect ratio trapping approach. Aspect ratio trapping (ART) refers to a technique where crystalline defects are terminated at non-crystalline, for example dielectric, sidewalls. U.S. Pat. No. 8,173,551 B2 discloses a method where a silicon substrate is covered with a dielectric layer defining trenches through to the substrate material. In the trenches, epitaxial films of a compound material are deposited wherein particular geometries of the growth front are realized. The aspect ratio of the trenches needs to be large enough to terminate the defects that nucleate at the silicon-compound interface so that higher parts of the crystalline compound show a low crystalline defect density. Some approaches of the ART technique teach the use of Germanium microcrystals grown in silicon oxide trenches on a silicon substrate with a gallium arsenide film on top.

Another ART approach is disclosed in U.S. Pat. No. 8,384,196 B2 employing an additional epitaxial layer overgrowth (ELO) of the trenches. Relatively thick compound semiconductor or germanium layers are obtained on the trench-forming dielectric, and the crystalline compound or germanium is preferably planarized prior to further processing.

It is therefore desirable to provide improved fabrication methods for semiconductor structures, in particular for structures comprising semiconductor compound materials.

SUMMARY

According to a first aspect, the invention is embodied as a method for fabricating a compound semiconductor structure. The method comprises providing a semiconductor substrate comprising a first semiconductor material, forming an insulating layer on the semiconductor substrate and forming an opening in the insulating layer. Thereby a seed surface of the substrate is exposed. The opening has sidewalls and a bottom and the bottom corresponds to the seed surface of the substrate. The method further comprises forming a cavity structure above the insulating layer. The cavity structure comprises the opening and a lateral growth channel extending laterally over the substrate. The method further comprises growing a matching array on the seed surface of the substrate. The matching array comprises at least a first semiconductor matching structure comprising a second semiconductor material and a second semiconductor matching structure comprising a third semiconductor material. The method further comprises growing the compound semiconductor structure comprising a fourth semiconductor material on a seed surface of the second matching structure. The first, the second, the third and the fourth semiconductor material are different from each other.

Methods according to embodiments of the first aspect may facilitate an efficient fabrication of compound semiconductor structures with low defects and high quality. The matching array comprising the first and the second matching structure can advantageously be used to reduce defects in the growth of the compound semiconductor material by solving growth mismatches between the first and the fourth semiconductor materials. Such growth mismatches may e.g. occur due to the different lattice constants, different crystal structures or other differences between the first and the fourth semiconductor material. The seed surface of the substrate may preferably be embodied as crystalline seed surface.

The term "laterally" is used in this context, as is customary, to indicate orientation generally parallel to the plane of the substrate, as opposed to generally vertically, or outwardly, from the substrate surface.

According to a preferred embodiment the first and the second matching structure are adapted to solve a growth mismatch between the first and the fourth semiconductor material in a stepwise approach. With such a stepwise approach the growth mismatches may be adapted gradually. This allows to address the various possible mismatches step by step.

According to a further preferred embodiment the first matching structure provides a first matching level between the first and the second semiconductor material. The second matching structure provides a second matching level between the second semiconductor material and the third semiconductor material and the compound semiconductor structure provides a third matching level between the third semiconductor material and the fourth semiconductor material. The first, the second and the third matching level may address a plurality of matching parameters in a sequential way.

A matching level may be defined as a level indicating the degree of matching related to crystal growth of semiconductor structures. The higher the matching level, the better are the corresponding two semiconductor materials suited for crystal growth on one another and the lower the defects of the crystal growth. A matching parameter may be any parameter that has an influence on the crystal growth of semiconductor materials. Each matching level may be used to improve the match in one or more of the matching parameters. Such an improvement encompasses a gradual improvement of one or more matching parameters over two or more matching levels as well as providing a full match of one or more of the matching parameters in a single matching level.

According to a preferred embodiment the third matching level is higher than the second matching level and the second matching level is higher than the first matching level.

By gradually increasing the matching level from the first matching structure to the second matching structure and finally to the compound semiconductor structure, the mismatch between the first semiconductor material and the fourth semiconductor material may be solved or addressed respectively gradually in a sequential way.

According to a further preferred embodiment the first, the second and the third matching level comprise as first matching parameter a lattice match of the lattice constant, as second matching parameter a structural match of the crystal structure and as third matching parameter a chemical similarity match.

These three matching parameters have been found to be the most important ones for enabling defect free growth of a compound semiconductor structure.

According to a preferred embodiment each of the first, the second and the third matching levels provide an improved match in at least one of the three matching parameters.

This facilitates an efficient and reliable matching in a step by step approach. An improved match may be embodied in various ways. As an example, a large lattice mismatch may be solved by gradually reducing the lattice mismatch in a step by step approach.

According to a further preferred embodiment the first matching level provides a match in one of the three matching parameters, the second matching level provides a match in two of the three matching parameters and the third matching level provides a match in three of the three matching parameters.

Such an embodiment allows to address the matching parameters sequentially in a step by step approach and to increase the total matching level gradually. By addressing these three parameters in a step by step approach, the growth mismatch between the first semiconductor material and the fourth semiconductor material may be solved in a reliable and efficient way.

According to a further preferred embodiment the first matching structure is essentially lattice matched to the semiconductor substrate, but structurally different to the semiconductor substrate; the second matching structure is structurally matched to the first matching structure, but lattice mismatched to the first matching structure and the compound semiconductor structure is lattice matched and structurally matched to the second matching structure.

By addressing the mismatch in this specific order, the growth mismatch between the first semiconductor material and the second semiconductor material is solved in a reliable and efficient way.

According to a further preferred embodiment the first semiconductor material is an elementary material. This allows to use standard substrates such as Si-substrates suitable for high volume manufacturing.

According to a further preferred embodiment the second and the third second semiconductor material are binary materials and the third semiconductor material is a ternary material.

Ternary materials and especially InGaAs are being considered as a potential alternative for replacing strained Si in the channel of future nFETs due to their remarkable electron mobility. Moreover, some III-V ternary compound semiconductors present several advantages for opto-electronics applications when compared to Si. Using binary materials for the first and the second matching structure has been found to offer several suitable combinations to address the mismatches in a step by step approach.

According to a further preferred embodiment the semiconductor substrate has a diamond crystal structure and the first matching structure, the second matching structure and the compound semiconductor structure have a zinc blende crystal structure.

This offers several suitable combinations to address the mismatches in a step by step approach. Standard substrates such as Si-substrates have often a diamond crystal structure, while III-V-compound materials have often a zinc blende structure.

According to a further preferred embodiment the first semiconductor material is a group IV material and the second, the third and the fourth semiconductor materials are group III-V compound materials or group II-VI compound materials. This allows to grow III-V or II-VI compound materials on standard substrates such as Si-substrates, thereby enabling high volume manufacturing.

According to a further preferred embodiment the first semiconductor material is silicon, the fourth semiconductor material is InGaAs and the second and third semiconductor materials are selected from the pairs consisting of: (GaP, InP); (Ge, GaAs) and (GaSb, GaAsSb).

These combinations have been found to be particularly suitable to fabricate InGaAs structures in an efficient and reliable way. According to embodiments a reference to InGaAs generally includes any suitable combinations of $In_xGa_{1-x}As$ where x=0 to 1.

According to a further preferred embodiment the method comprises growing the first matching structure in the opening and growing the second matching structure at least partially in the lateral growth channel. This has been found to reduce defects in an efficient and reliable way.

According to a further preferred embodiment the growing of the first matching structure, the second matching structure and the compound semiconductor structure is performed by metal organic chemical vapor deposition (MOCVD), by atmospheric pressure CVD, by low or reduced pressure CVD, by ultra-high vacuum CVD, by molecular beam epitaxy (MBE), by atomic layer deposition (ALD) or by hydride vapor phase epitaxy.

Such methods are well established and allow a precise and reliable control of the growth of the first matching structure, the second matching structure and the compound semiconductor structure According to a further preferred embodiment the step of forming the cavity comprises forming a sacrificial structure in the opening and on the insulating layer; forming a cavity layer on the sacrificial structure; forming an inlet in the cavity layer, thereby exposing a surface of the sacrificial structure; and selectively removing the sacrificial structure, thereby exposing the seed surface of the substrate.

This allows an efficient fabrication of cavities.

According to a further preferred embodiment the opening of the insulating layer is connected to two or more lateral growth channels extending in different growth directions.

This allows growing two or more compound semiconductor structures in parallel.

According to a further preferred embodiment the method comprises growing sequentially in the growth channel in an alternating way one or more first compound semiconductor structures of the fourth semiconductor material and one or more second compound semiconductor structures of a fifth semiconductor material. The fourth semiconductor material is different from the fifth semiconductor material. The first compound semiconductor structures provide a seed surface for the second compound semiconductor structures and the second compound semiconductor structures provide a seed surface for the first compound semiconductor structures. By selectively etching the first or the second compound semiconductor structures a fin structure comprising a plurality of parallel fins of the first or the second compound semiconductor structures can be formed.

According to a further preferred embodiment the width of the first and the second compound semiconductor structures in the growth direction is controlled via the time of the epitaxial growth. This allows to define the dimensions of the fin structure by epitaxy rather than by lithography.

According to a further preferred embodiment a geometrical constraint is provided in the growth channel to reduce in plane crystalline defects.

According to a further preferred embodiment the geometrical constraint is an in plane necking of the growth channel.

According to a further preferred embodiment the geometrical constraint is a change of the in plane direction of the growth channel.

According to an embodiment of another aspect of the invention a compound semiconductor structure is provided comprising a semiconductor substrate comprising a first semiconductor material, an insulating layer on the semiconductor substrate and an opening in the insulating layer. The opening has sidewalls and a bottom, wherein the bottom corresponds to a seed surface of the substrate. The structure further comprises a cavity structure above the insulating layer, the cavity structure comprising the opening and a lateral growth channel extending laterally over the substrate. The semiconductor structure comprises furthermore a matching array epitaxially grown on the seed surface of the substrate. The matching array comprises at least a first semiconductor matching structure comprising a second semiconductor material and a second semiconductor matching structure comprising a third semiconductor material. The semiconductor structure comprises furthermore a compound semiconductor structure comprising a fourth semiconductor material epitaxially grown on a seed surface of the matching array. The first, the second, the third and the fourth semiconductor material are different from each other.

According to an embodiment of another aspect a compound semiconductor structure obtainable by a method according to the first aspect is provided.

A further preferred embodiment relates to a wafer comprising a plurality of semiconductor structures obtainable by a method according to the first aspect.

A further preferred embodiment relates to an electronic device comprising a plurality of semiconductor structures obtainable by a method according to the first aspect.

The steps of the different aspects of the invention may be performed in different orders. Furthermore, the steps may also be combined, i.e. that e.g. two or more steps may be performed together.

Advantages of the features of one aspect of the invention may apply to corresponding features of another aspect of the invention.

Embodiments of the invention will be described in more detail below, by way of illustrative and non-limiting examples, with reference to the accompanying drawings.

BRIEF DESCRIPTION OF THE DRAWINGS

FIG. 19 shows a top view corresponding to the cross-sectional view of the structure of FIG. 18;

FIG. 20 shows a cross-sectional view of a structure having lateral growth channels with in plane neckings as geometrical constraint for reducing in plane defects;

FIG. 25 shows a cross-sectional view of the structure of FIG. 23 after selectively etching the fifth semiconductor structures; and FIG. 26 shows a corresponding top view of the structure of FIG. 25.

DETAILED DESCRIPTION

FIGS. 1-14 show successive stages of a method for fabricating a compound semiconductor structure.

FIGS. 1-14 and the other Figures subsequently described below generally show enlarged cross-sectional views or top views of initial, intermediate and final structures formed during the stages of the method. In any or all of the figures the dimensions may not be drawn to scale and may be shown in a simplified and schematic way to illustrate the features and principles of embodiments of the invention.

Figure 1:
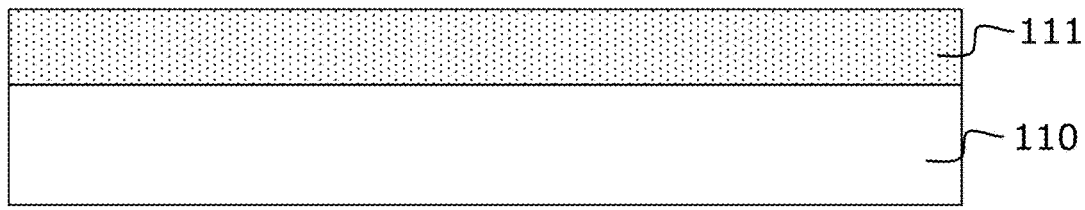
FIG. 1 illustrates a cross-sectional view of an initial structure comprising a substrate covered with an insulating layer.

FIG. 1 illustrates a cross-sectional view of an initial structure 100. The initial structure 100 comprises a substrate 110. The substrate 110 comprises a first semiconductor material and may be e.g. a bulk semiconductor substrate, a substrate comprising an insulating layer such as a silicon on insulator (SOI) substrate or a hybrid substrate. The substrate 110 may be embodied as a crystalline semiconductor or a compound semiconductor wafer of a large diameter. The substrate may comprise, for example, a material from group IV of the periodic table as first semiconductor material. Materials of group IV include, for example, silicon, germanium, mixed silicon and germanium, mixed silicon and carbon, mixed silicon germanium and carbon and the like. For example, the substrate 110 may be a crystalline silicon wafer that is used in the semiconductor industry.

On the substrate 110 an insulating layer 111 is provided. The insulating layer 111 may be embodied e.g. as a dielectric layer. The insulating layer 111 can be formed by known methods, as for example thermal oxidation, chemical vapor deposition (CVD), plasma enhanced CVD (PECVD), atomic layer deposition, chemical solution deposition, MOCVD, evaporation, sputtering and other deposition processes. Examples of such dielectric material include, but are not limited to: SiO2, Si3N4, Al2O3, AlON, Ta2O5, TiO2, La2O3, SrTiO3, LaAlO3, ZrO2, Y2O3, Gd2O3, MgO, MgNO, Hf-based materials and combinations including multilayers thereof.

The thicknesses of the substrate 110 and the insulating layer 111 can be any suitable thicknesses.

Figure 2:
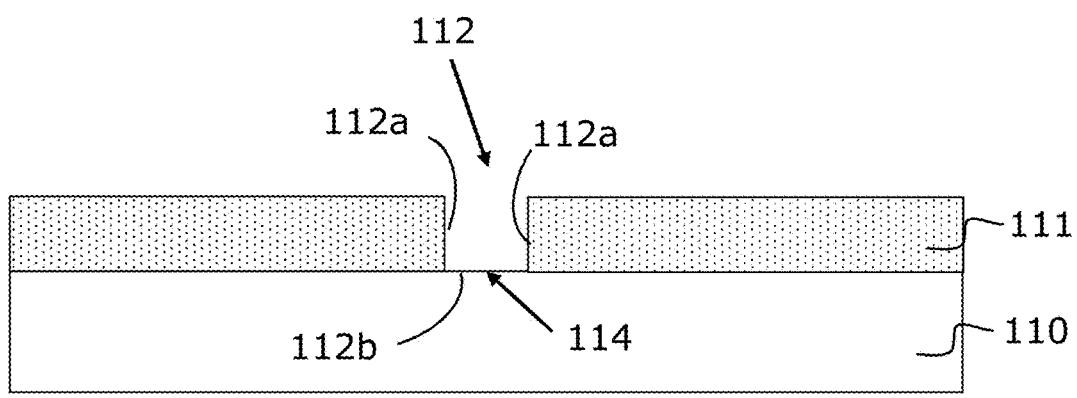
FIG. 2 shows a cross-sectional view of the structure of FIG. 1 after an opening has been formed in the insulating layer.

FIG. 2 shows a cross-sectional view of a structure 200 after an opening 112 has been formed in the insulating layer 111. The opening 112 has sidewalls 112a and a bottom 112b. The bottom 112b corresponds to a seed surface 114 of the substrate. The formation of the opening 112 may be performed by lithography and subsequent wet or dry etching techniques.

Figure 3:
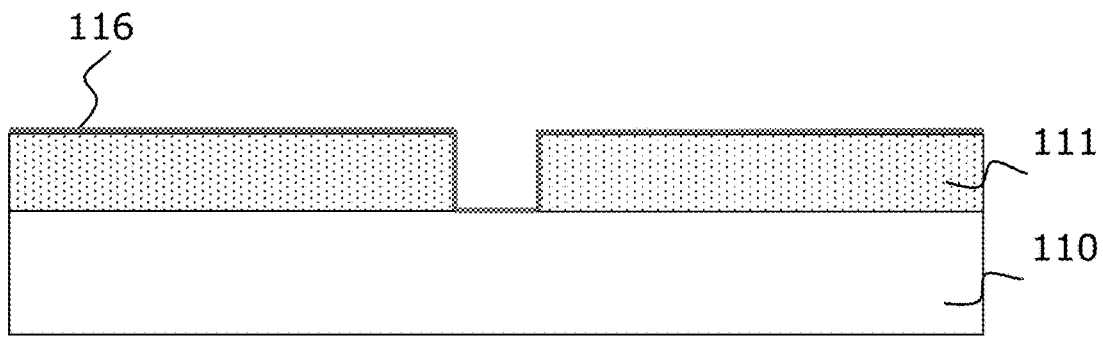
FIG. 3 shows a cross-sectional view of the structure of FIG. 2 after a high-k layer has been deposited on exposed surfaces of the insulating layer and a seed surface of the substrate.

FIG. 3 shows a cross-sectional view of a structure 300 after a high-k layer 116 has been deposited by conformal deposition of a high-k material on the exposed surfaces of the insulating layer 111 and seed surface 114. The conformal deposition of the high-k material may be performed by methods well known in the art such as PECVD or PEALD.

Figure 4:
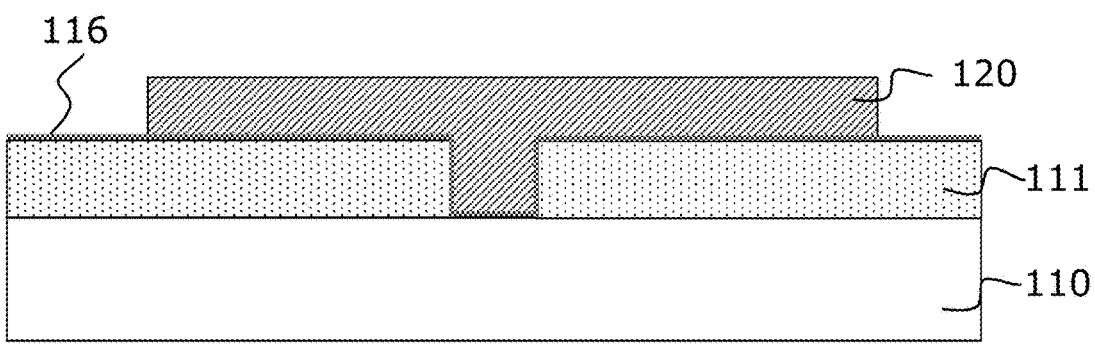
FIG. 4 shows a cross-sectional view of the structure of FIG. 3 after a sacrificial structure has been formed on the insulating layer and the high-k layer.

FIG. 4 shows a cross-sectional view of a structure 400 after a sacrificial structure 120 has been formed on the insulating layer 111 and the high-k layer 116 respectively. The sacrificial structure 120 comprises a sacrificial material. The sacrificial structure 120 establishes a negative mold for a cavity to be formed subsequently. According to some embodiments the sacrificial structure 120 may comprise amorphous silicon as sacrificial material. According to other embodiments one may also use polymers or other suitable materials that can be removed easily in a subsequent step. According to another preferred embodiment the sacrificial material may comprise $Si_xGe_{1-x}$ where x=0 to 1, poly-Silicon, amorphous silicon or amorphous carbon. This allows to use a plurality of well-known and established fabrication processes and methods to form the sacrificial structure 120. The sacrificial structure 120 may be deposited in a technology that is particularly suitable for the respective sacrificial material and may have any desired form and shape. Fabrication processes such as lithography and etching processes may be adapted and optimized for the respective sacrificial material.

Figure 5:
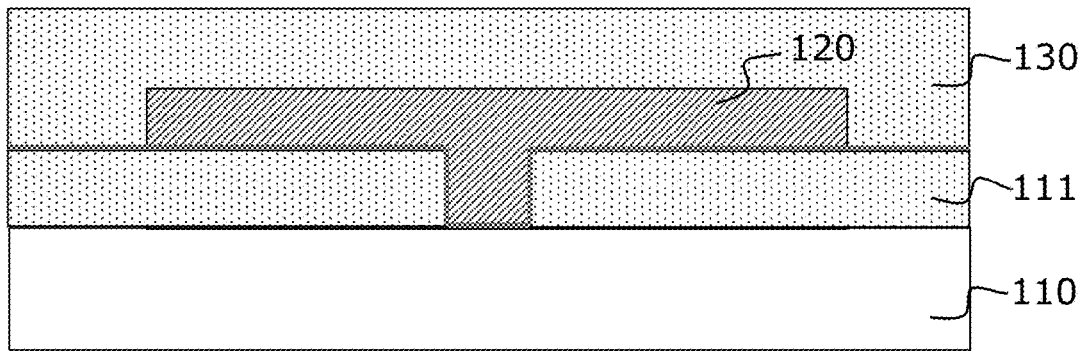
FIG. 5 shows a cross-sectional view of the structure of FIG. 5 after a cavity layer has been formed.

FIG. 5 shows a cross-sectional view of a structure 500 after a cavity layer 130 has been formed on all exposed surfaces of the structure 400. More particularly, the cavity layer 130 was formed on the sacrificial structure 120 and on the insulating layer 111. The cavity layer 130 is typically an insulating layer, e.g. of an oxide such as silicon oxide or silicon nitride, but might also be a layer of carbon or of other materials suppressing deposition of the semiconductor during a subsequent selective growth in the cavity structure. According to an embodiment the cavity layer 130 may be formed e.g. as blanket oxide layer using conformal deposition techniques as mentioned above.

According to embodiments the material of the cavity layer 130 is selected to have a low sticking coefficient, and hence low nucleation probability, for the semiconductor material to be grown in the cavity structure.

Figure 6:
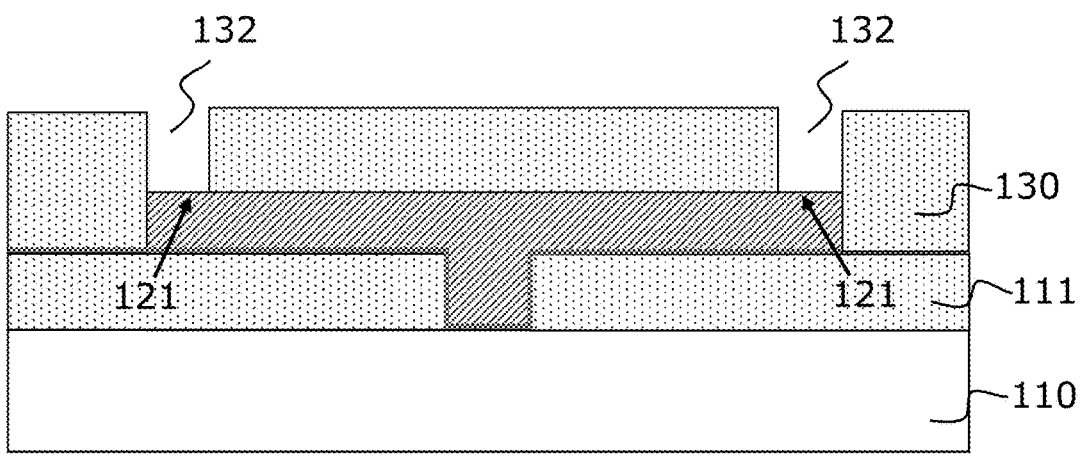
FIG. 6 shows a cross-sectional view of the structure of FIG. 5 after two inlets have been formed in the cavity layer.

FIG. 6 shows a cross-sectional view of a structure 600 after two inlets 132 have been formed in the cavity layer 130. This has exposed surfaces 121 of the sacrificial structure 120. The formation of the inlets 132 may be performed by lithography and subsequent wet or dry etching techniques.

Figure 7:
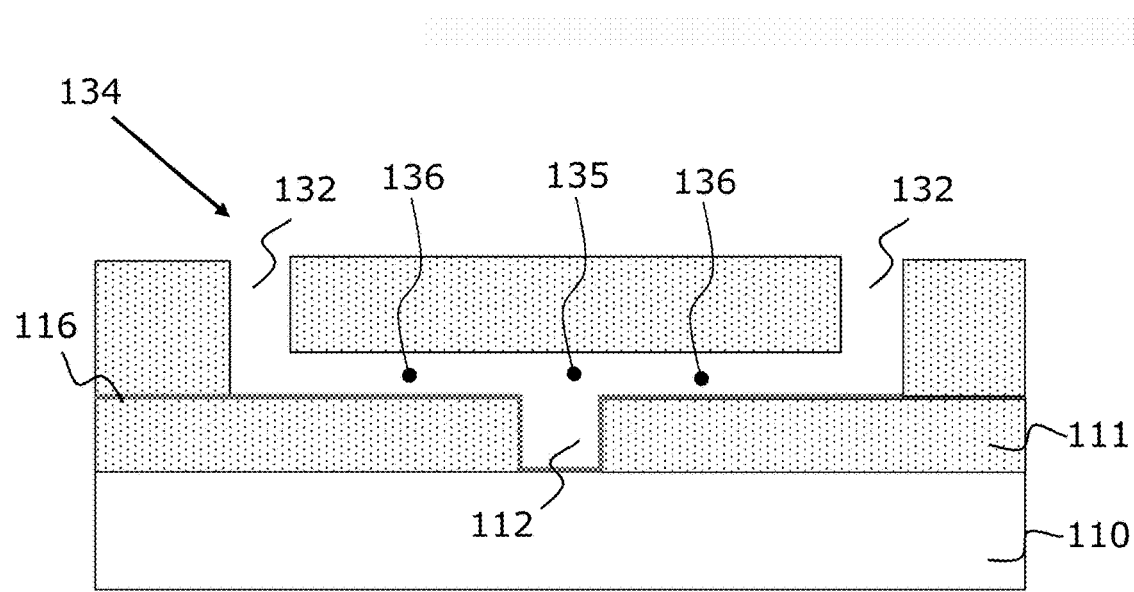
FIG. 7 shows a cross-sectional view of the structure of FIG. 6 after the sacrificial structure has been selectively removed.

FIG. 7 shows a cross-sectional view of a structure 700 after the sacrificial material of the sacrificial structure 120 has been selectively removed. This has formed a cavity structure 134 comprising a cavity 135 above the insulating layer 111. The cavity 135 comprises the opening 112 and two lateral growth channels 136 extending laterally over the substrate 110. The selective removal may be performed by selective etching techniques. The suitable etching technique may depend on the material used as sacrificial material. There are, for example, etching techniques available that selectively remove amorphous silicon as sacrificial material. According to a preferred embodiment the sacrificial material may be $Si_xGe_{1-x}$ and the selective etching may be performed by dry etching with e.g. xenon difluoride ($XeF_2$) or wet etching with e.g. TMAH. In general the etching technique is chosen to be such that it only etches the sacrificial material of the sacrificial structure 120, but neither the material of the cavity layer 130 nor the material of the high-k layer 116. Accordingly the etching stops at the high-k layer 116.

Figure 8:
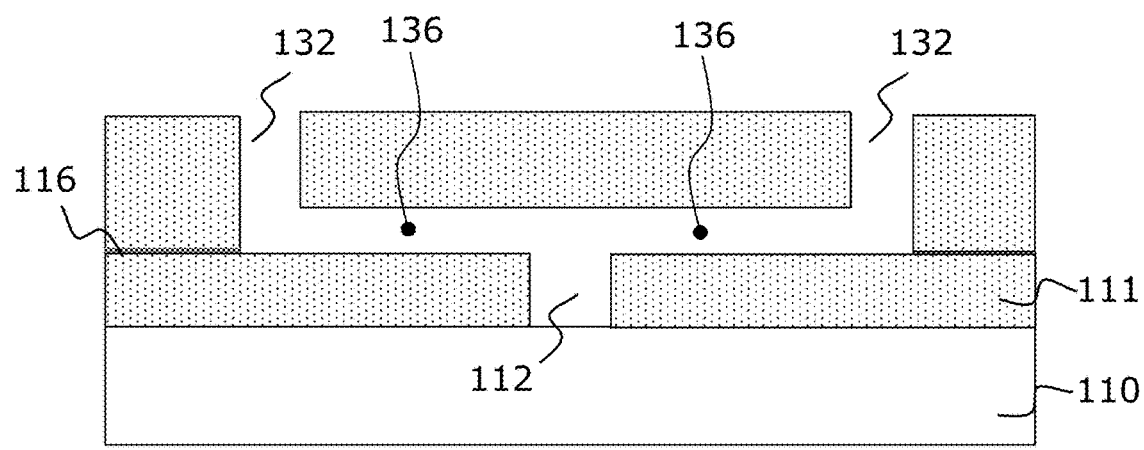
FIG. 8 shows a cross-sectional view of the structure of FIG. 7 after the high-k-layer has been selectively removed.

FIG. 8 shows a cross-sectional view of a structure 800 after the high-k-layer 116 has been selectively removed. The selective removal of the high-k layer 116 may be performed by suitable selective etching techniques that are chosen to be such that they only etch the high-k-layer, but neither the material of the cavity layer 130 nor the substrate 110. Accordingly the etching stops at the substrate 110.

Figure 9:
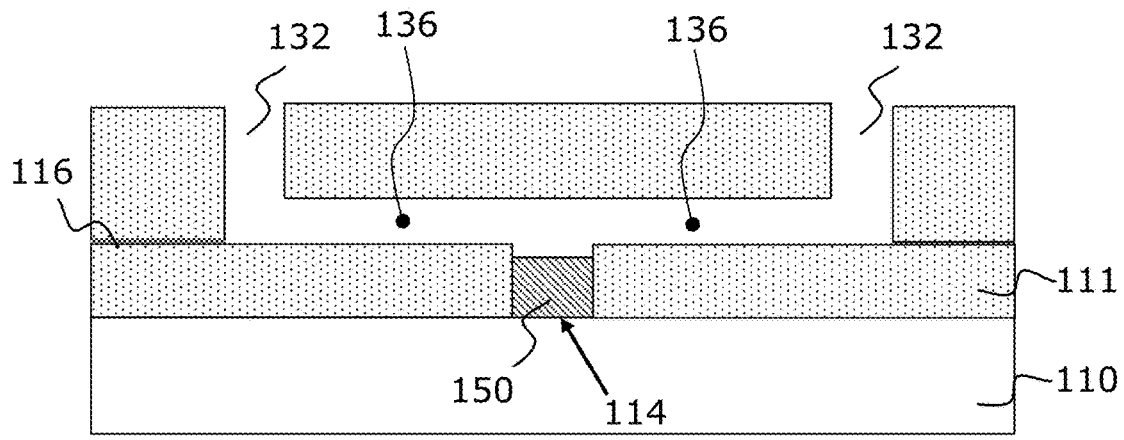
FIG. 9 shows a cross-sectional view of the structure of FIG. 8 after growing from the seed surface of the substrate a first matching structure.

FIG. 9 shows a cross-sectional view of a structure 900 after growing from the seed surface 114 of the substrate 110 a first matching structure 150 comprising a second semiconductor material.

Figure 10:
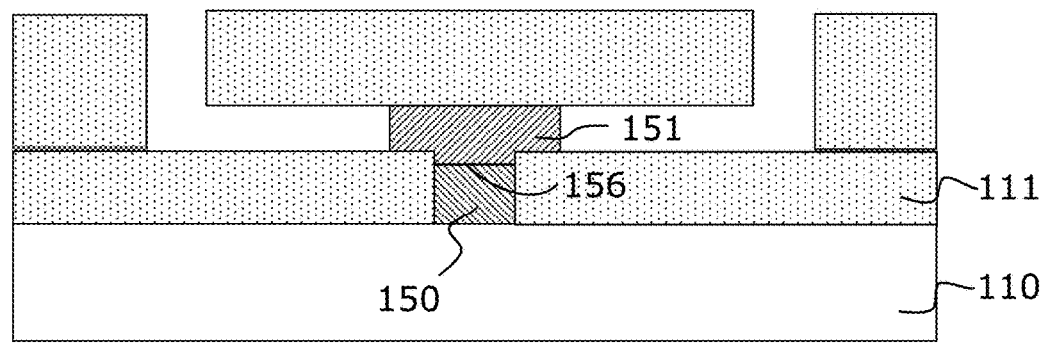
FIG. 10 shows a cross-sectional view of the structure of FIG. 9 after growing from a seed surface of the first matching structure a second matching structure.

FIG. 10 shows a cross-sectional view of a structure 1000 after growing from a seed surface 156 of the first matching structure 150 a second matching structure 151 comprising a third semiconductor material.

Figure 11:
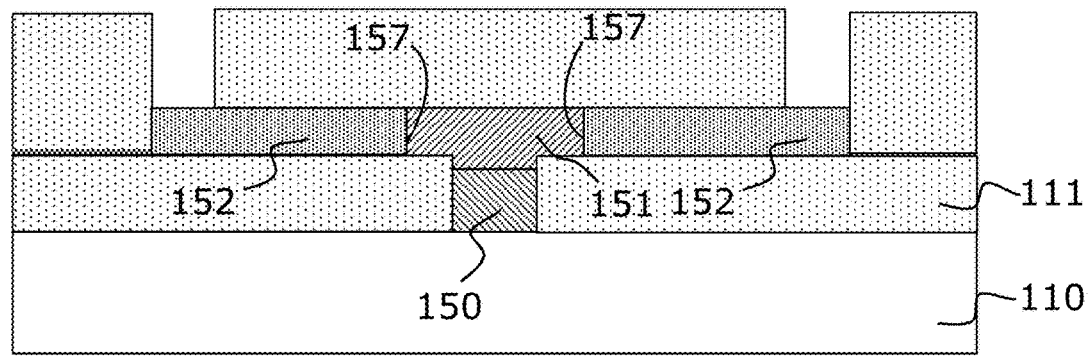
FIG. 11 shows a cross-sectional of the structure of FIG. 10 after growing from seed surfaces of the second matching structure a compound semiconductor structure.

FIG. 11 shows a cross-sectional view of a structure 1100 after growing from seed surfaces 157 of the second matching structure 151 compound semiconductor structures 152 comprising a fourth semiconductor material.

The first matching structure 150 and the second matching structure 151 form a matching array.

The seed surfaces 157 of the second semiconductor matching structure 151 form according to this embodiment a seed surface of the matching array.

In general, the first, the second, the third and the fourth semiconductor material are different from each other.

The growth of the first semiconductor matching structure, the second semiconductor matching structure and the compound semiconductor structure may be performed in particular by selective epitaxy in any suitable deposition system. For example, metal organic chemical vapor deposition (MOCVD), atmospheric pressure CVD, low or reduced pressure CVD, ultra-high vacuum CVD, molecular beam epitaxy (MBE) or atomic layer deposition (ALD) techniques can be employed.

In general the first matching structure 150 and the second matching structure 151 are designed to solve a growth mismatch between the first and the fourth semiconductor material in a stepwise approach. For this, the first matching structure 150 may be embodied to provide a first matching level between the first semiconductor material of the substrate 110 and the second semiconductor material of the first matching structure 150. Furthermore, the second matching structure 151 may be embodied to provide a second matching level between the second semiconductor material of the first matching structure 150 and the third semiconductor material of the second matching structure 151. Finally the compound semiconductor structure 152 may be embodied to provide a third matching level between the third semiconductor material of the second matching structure 151 and the fourth semiconductor material of the compound semiconductor structure 153. The first, the second and the third matching level can be used to address a plurality of matching parameters in a sequential way.

According to an embodiment the matching levels may be defined by matching parameters. According to a preferred embodiment the first, the second and the third matching level may be defined by three matching parameters. As first matching parameter a lattice match of the lattice constants of two adjacent materials may be used. As second matching parameter a structural match of the crystal structure of two adjacent materials may be used. Finally, as third matching parameter a chemical similarity match may be used.

According to embodiments of the invention chemical similarity refers to the similarity of semiconductor materials with respect to a predefined set of functional qualities of the semiconductor materials. The predefined set of functional qualities may comprise in particular the interdiffusion characteristics of two adjacent semiconductor materials. In this respect according to embodiments of the invention two semiconductor materials are considered chemically similar if there is no or hardly any diffusion between the two semiconductor materials. Interdiffusion may refer in particular to the dopant characteristics of two semiconductor materials. Hence according to embodiments of the invention two semiconductor materials are considered chemically similar if they are not dopants to each other. Furthermore, according to embodiments group III-V compound semiconductor materials may generally be considered chemically similar to each other, while group III-V compound semiconductor materials may be considered chemically non similar to group IV materials.

According to embodiments of the invention two semiconductor materials are considered as lattice matched if the difference between the lattice constants is less than 25 pm, preferably less 10 pm, more preferably less than 5 pm and most preferably less than 3 pm.

According to embodiments of the invention two semiconductor materials are considered as structurally matched if they have the same crystal structure, e.g. if they both have a diamond crystal structure or both a zinc blende crystal structure.

In order to gradually adapt the matching level, the third matching level may be higher than the second matching level and the second matching level may be higher than the first matching level. According to embodiments the first, the second and the third matching level may provide an improved match in at least one of the three matching parameters.

In the following a preferred embodiment will be explained in more detail. According to this embodiment the first semiconductor material of the substrate 110 is silicon and the second semiconductor material of the adjacent first matching structure 150 is GaP. This combination Si—GaP provides a match in one of the three matching parameters described above, namely a match in the lattice constant. Si has a lattice constant of 0.543 nm at 300 K and GaP a lattice constant of 0.545 at 300 K. Hence the difference in the lattice constant is only in the order of 2 pm which can be considered as a lattice match as explained above. Si has a diamond cubic crystal structure while GaP has a zinc blende crystal structure. Accordingly both are mismatched concerning the second lattice parameter. Also chemically they are different, in particular in view of their interdiffusion characteristics. More particularly, GaP is a dopant to Si and hence Ga and P atoms diffuse into the Si. Hence the third matching parameter concerning chemical similarity is also no match.

According to this embodiment the third semiconductor material of the second matching structure is InP. The combination GaP-InP provides a match in two of the three matching parameters described above, namely a structural match in the crystal structure and a chemical similarity match. InP has a lattice constant of 0.587 nm at 300 K which differs from the lattice constant 0.545 of GaP by 32 pm which is above the highest threshold of 25 pm as defined above. Hence this may be considered as a lattice mismatch. Both GaP and InP have a zinc blende crystal structure, hence there is a structural match and accordingly a match in the second matching parameter. Finally InP and GaP are chemically similar and hence there is a match in the third matching parameter. More particularly, both are III-V compound binary materials and are non-dopant to each other.

Finally the fourth semiconductor material of the compound semiconductor structure is InGaAs. InGaAs has a lattice constant of 0.587 nm at 300 K and is hence lattice matched to InP. Furthermore, InGaAs has a zinc blende crystal structure and is hence structurally matched to InP. Finally, InGaAs is chemically similar to InP. The latter is based on the fact that InP and InGaAs are both III-V compound materials and non-dopant to each other.

Hence there is a match in all three matching parameters.

According to another preferred embodiment the first semiconductor material of the substrate is Si, the second semiconductor materials is Ge, the third semiconductor material is GaAs and the fourth semiconductor material is InGaAs.

According to this embodiment the first matching level provides a structural match as Si and Ge both have a diamond crystal structure. The lattice constant of Ge is 0.566 nm at 300 K and hence differs from the lattice constant 0.543 by 0.23 pm. This is still lower than the highest threshold of 0.25 pm as mentioned above. Hence according to some embodiment this may be considered as a lattice match while according to other embodiment this may be considered as a lattice mismatch. Finally, Si and Ge may be considered chemically similar. Hence according to this embodiment the first matching level provides a match in two or three of the matching parameters depending on the threshold chosen for a lattice match. The second matching level provides a structural mismatch as GaAs has a zinc blende structure. GaAs has a lattice constant of 0.565 nm at 300 K and hence there is an excellent lattice match between Ge and GaAs. Chemically Ge and GaAs may be considered non similar as Ga and As are dopants for Ge. Hence the second matching level provides a match in one matching parameter. But importantly it provides an excellent match in the parameter that was different or a moderate match respectively in the first matching level, namely the lattice constant. In this respect, the second matching level provides an improved match in the first matching parameter, namely in the lattice constant. Finally the third matching level provides a structural match as InGaAs and GaAs have both a zinc blende structure. Furthermore, they may be considered chemically similar as they are non-dopants to each other. The lattice constants (0.565 vs. 0.587) differ by app. 22 pm. This is still lower than the highest threshold of 25 pm according to the definition provided above and can hence be still considered as a lattice match according to embodiments of the invention. But importantly the difference in lattice constants between InGaAs and GaP (22 pm) is significantly lower than the initial difference of 44 pm between Si and InGaAs.

According to another preferred embodiment the first semiconductor material of the substrate is Si, the second semiconductor materials is GaSb, the third semiconductor material is GaAsSb and the fourth semiconductor material is InGaAs.

According to this embodiment the first matching level provides a structural mismatch as Si has a diamond crystal structure while GaSb has a zinc blende structure. The lattice constant of GaSb is with 0.609 mismatched to the lattice constant 0.54 of Si. In addition, Si and GaSb may be considered chemically non similar as Ga and Sb are dopants for Si. Hence according to this embodiment the first matching level provides no match in the three above mentioned matching parameters. However, the lattice constant of GaSb differs substantially less (0. 22 pm) from the "target" lattice constant of InGaAs than the lattice constant of the initial Si (44 pm). In this respect an improvement in the first lattice parameter has been made. The second matching level provides a structural match as GaSb and GaAsSb have both a zinc blende structure. The lattice constant of GaAsSb (0.587 nm at 300 K) differs to the constant 0.609 of GaSb by app. 22 pm. As this is still lower than the highest threshold of 25 pm according to the definition provided above it can hence be still considered as a lattice match according to embodiments of the invention. Chemically GaAsSb and GaSb may be considered similar to each other as they are non-dopants to each other. Hence the second matching level may be considered as providing already a match in three of the three matching parameters, wherein in particular the matching parameter "lattice constant" offers still room for improvement. Finally the third matching level provides a structural match as InGaAs and GaAsSb have both a zinc blende structure. Furthermore, they may be considered chemically similar as they are non-dopants to each other. In terms of lattice constants (0.587 for both) they provide an excellent match. Hence the third matching level also provides a match in three of the three matching parameters. Notably, the match of the first matching parameter "lattice constant" has improved over the second matching level and accordingly also the degree of matching has improved over the second level in view of the better match of the lattice constants.

Figure 12:
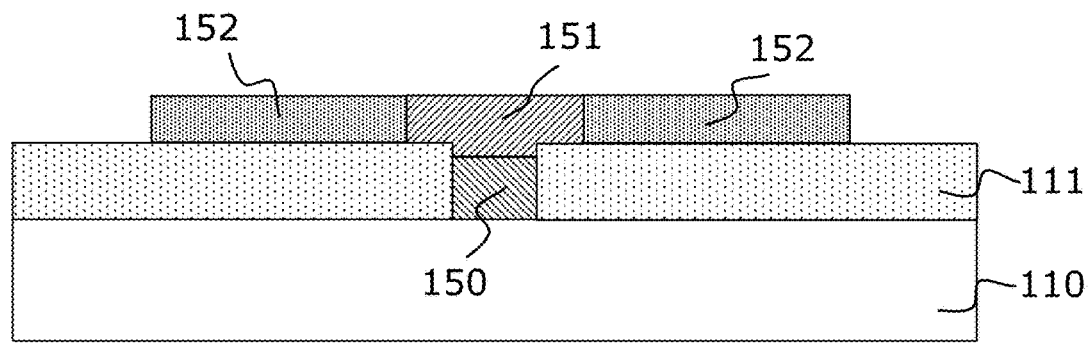
FIG. 12 shows a cross-sectional view of the structure of FIG. 11 after removal of the cavity layer.

FIG. 12 shows a cross-sectional view of a structure 1200 after removal of the cavity layer 130. This may be done by suitable etching techniques.

Figure 13:
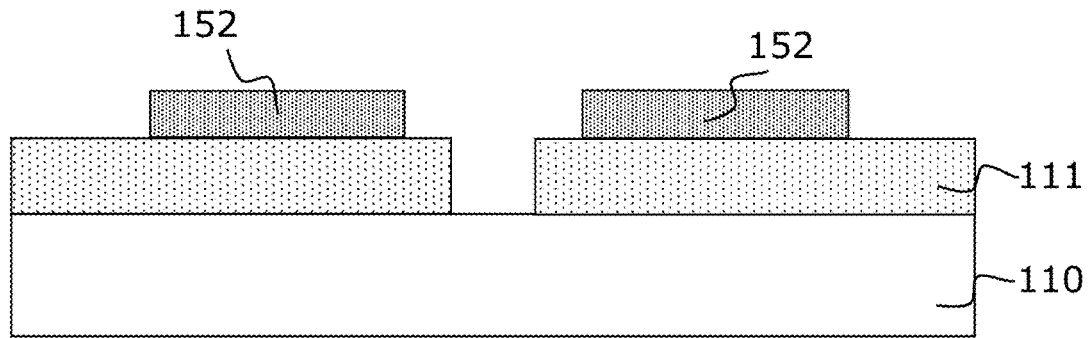
FIG. 13 shows a cross-sectional view of the structure of FIG. 12 after removal of the first matching structure and the second matching structure.

FIG. 13 shows a cross-sectional view of a structure 1300 after removal of the first matching structure 150 and the second matching structure 151. This may be done by suitable selective etching techniques and electrically isolates the compound semiconductor structures 152 from the substrate 110.

Figure 14:
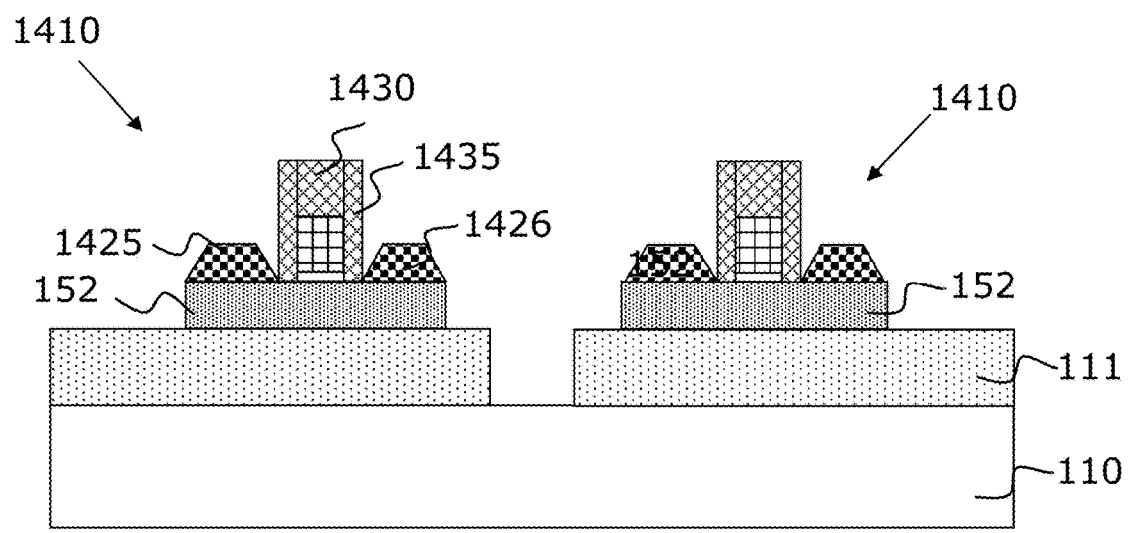
FIG. 14 shows a cross-sectional view of the structure of FIG. 13 after the fabrication of semiconductor devices on the compound semiconductor structures.

FIG. 14 shows as structure 1400 a cross-sectional view after the fabrication of semiconductor devices 1410 on the compound semiconductor structures 152. According to this embodiment the semiconductor devices 1410 are field effect transistors (FETs) 1410 and the compound semiconductor structure 152 form channel structures 152 of the FETs. The channel structures 152 may have a thickness of, for example, about 5 nm that corresponds to a desired channel thickness of the FETs 1410. On the channel structures 152 there are disposed gate stacks 1430 of the FETs 1410. The gate stacks 1430 may comprise a gate dielectric layer, a gate metal layer and a gate cap layer. On sidewalls of the gate stacks 1430 insulating spacers 1435 have been formed that insulate the gate stacks 1430 from raised source layers 1425 and raised drain layers 1426. The raised source layers 1425 and the raised drain layers 1426 may be formed by selective epitaxy. The raised source layers 1425 and the raised drain layers 1426 comprises the fourth semiconductor material and may hence be embodied as group III-V material or other suitable materials as mentioned above. The raised source layers 1425 and the raised drain layers 1426 may be doped with a dopant. The doping can be preferably performed by in-situ doping during the selective epitaxy step.

Figure 15:
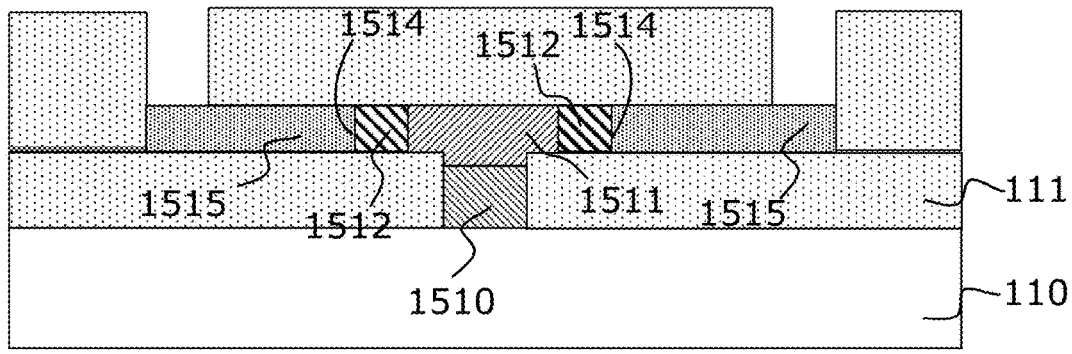
FIG. 15 shows a cross-sectional view of a structure illustrating another embodiment of a matching array comprises three matching structures.

FIG. 15 shows a cross-sectional view of a structure 1500 illustrating another embodiment of a matching array. According to this embodiment the matching array comprises a first matching structure 1510, a second matching structure 1511 and third matching structures 1512. On seed surfaces 1514 of the third matching structures 1512 compound semiconductor structures 1515 have been grown.

FIGS. 16-19 illustrate an exemplary embodiment of a growth channel that is provided with a geometrical constraint to reduce in plane crystalline defects.

Figure 16:
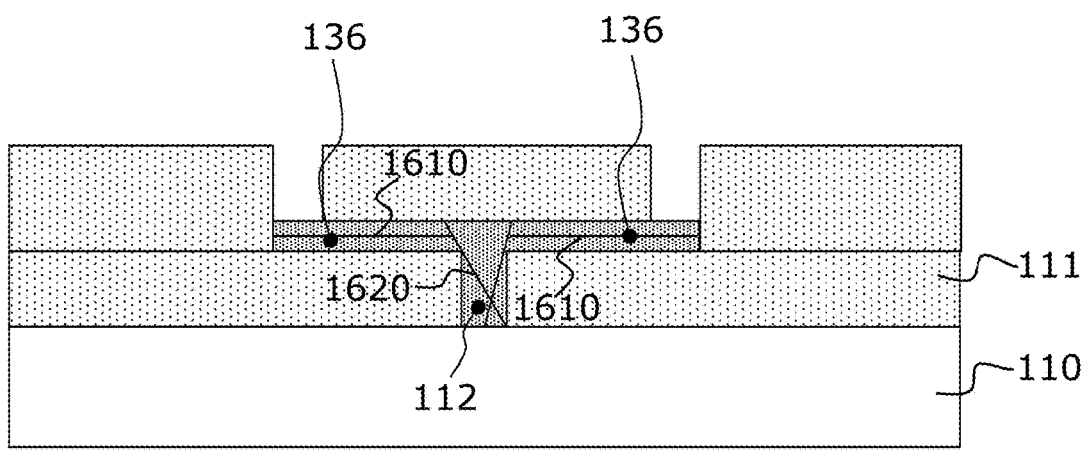
FIG. 16 shows a cross-sectional view of a structure having a lateral growth channel with a 90° curve as geometrical constraint for reducing in plane defects.

FIG. 16 shows a cross-sectional view of a structure 1600 having lateral growth channels 136. In a plane extending laterally over the substrate 110, in plane defects 1610 have been propagated in the lateral growth channels 136. In addition, defects 1620 have been grown in the opening of the insulating layer 111, but as these have propagated vertically/outwardly to the surface of the substrate 110, they can be filtered out by the 90° curve between the opening 112 and the growth channels 136.

Figure 17:
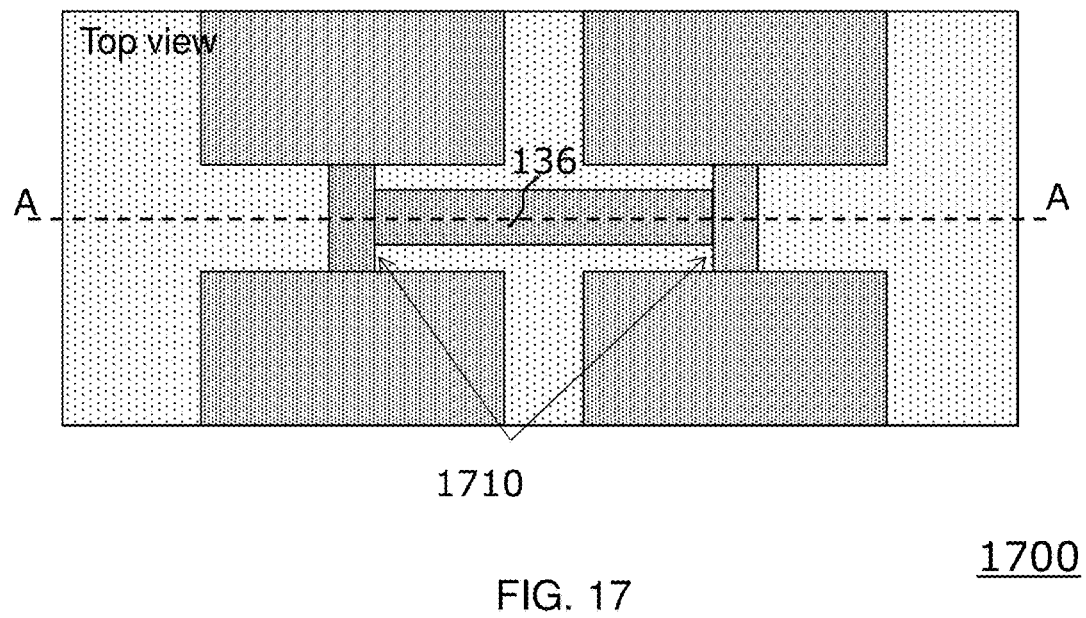
FIG. 17 shows a corresponding top view of the structure of FIG. 16.

FIG. 17 shows a corresponding top view of the structure 1600. More particularly, the structure 1600 is a cross section taken along the line A-A of FIG. 17. As can be seen in FIG. 17, geometrical constraints 1710 have been provided. In this embodiment the geometrical constraints 1710 are 90° in plane turns that provide a change of the in plane direction of the growth channel 136. These geometrical constraints 1710 filter out the in plane defects 1610.

Figure 18:
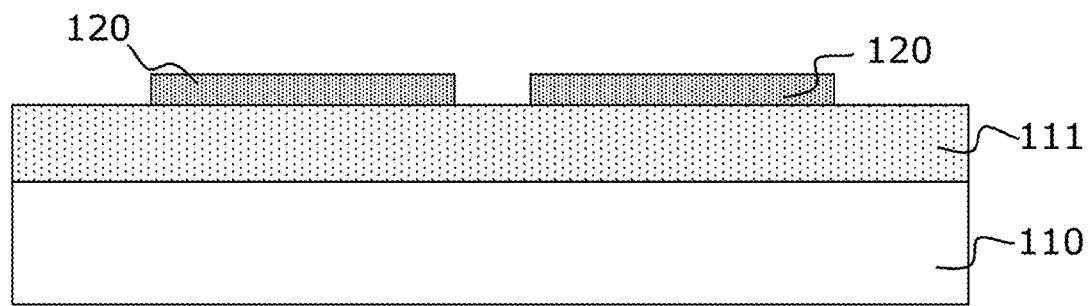
FIG. 18 shows a cross-sectional view of the structure of FIG. 16 after removal of the cavity structure.

FIG. 18 shows a cross-sectional view of a structure 1800 after removing the cavity structure 134 from the structure 1600 of FIG. 16 and after partially removing the grown semiconductor material from the opening 112, the lateral growth channel 136 and the geometrical constraint 1710.

FIG. 19 shows a top view corresponding to the cross-sectional view of the structure 1800. More particularly, the structure 1800 is a cross section taken along the line A-A of FIG. 19. The structure 1900 comprises 4 compound semiconductor structures 1910 that may be subsequently used as starting structures to form semiconductor devices, e.g. FETs, on top of it. As an example, the compound semiconductor structures 1910 may be used as channel structures for subsequently formed FETs.

FIG. 20 shows a cross-sectional view of a structure 2000 having lateral growth channels 136. In a plane extending laterally over the substrate 110, in plane defects 2010 have been propagated in the lateral growth channels 136. In addition, defects 2020 have been grown in the opening of the insulating layer 111, but as these have propagated vertically/outwardly to the surface of the substrate 110, they can be filtered out by the 90° curve between the opening 112 and the growth channels 136.

Figure 21:
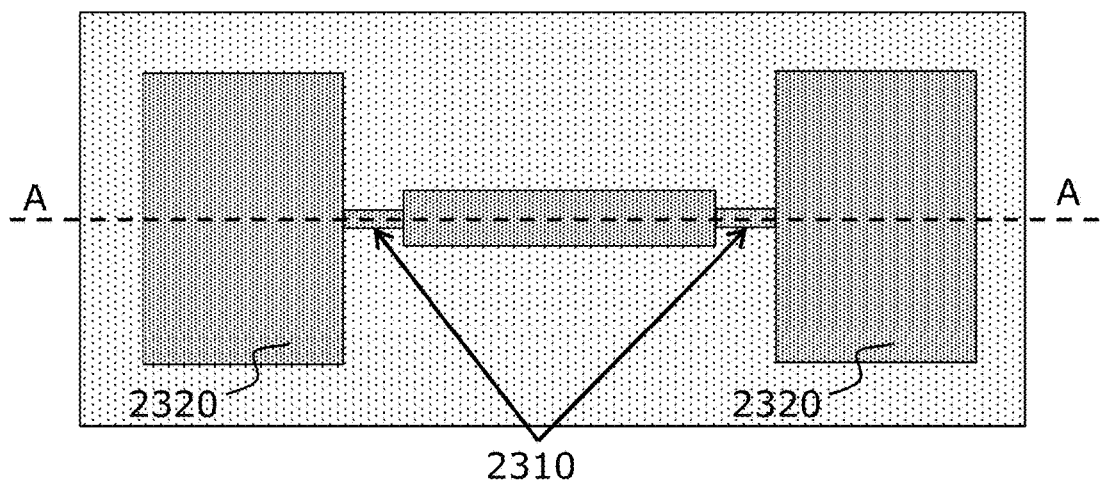
FIG. 21 shows a corresponding top view of the structure of FIG. 20.

FIG. 21 shows a corresponding top view of the structure 2000. More particularly, the structure 2000 is a cross section taken along the line A-A of FIG. 21. As can be seen in FIG. 21, geometrical constraints 2310 have been provided. In this embodiment the geometrical constraints 2310 are in plane neckings of the growth channel 136. The in plane neckings 2310 provide an in plane seed for the further growth, thereby filtering out the in plane defects 2010. The structure 2100 comprises 2 compound semiconductor structures 2320 that may be subsequently used as starting structures to form semiconductor devices, e.g. FETs, on top of it. As an example, the compound semiconductor structures 2320 may be used as channel structures for subsequently formed FETs.

FIGS. 22-26 illustrate method steps for growing a fin structure on a seed surface of the matching array of FIG. 10.

Figure 22:
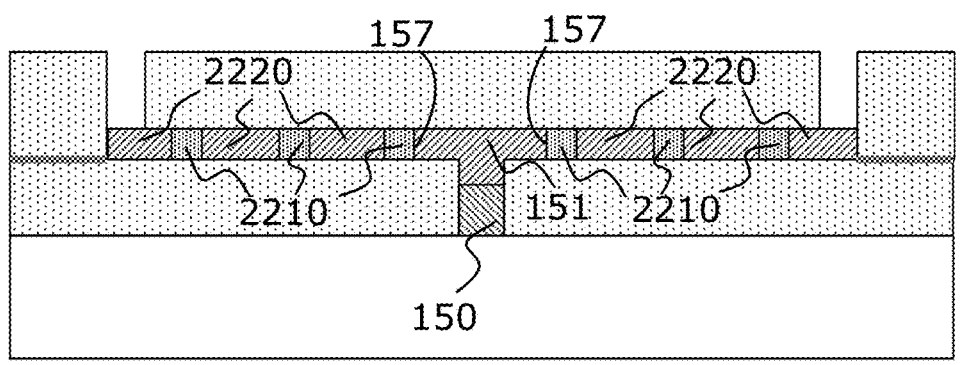
FIG. 22 shows a cross-sectional view after growing from the seed surfaces of the second matching structure sequentially in an alternating way first compound semiconductor structures and second compound semiconductor structures.

FIG. 22 shows a cross-sectional view of a structure 2200 after growing from the seed surfaces 157 of the second matching structure 151 sequentially in the lateral growth channel 136 in an alternating way first compound semiconductor structures 2210 of the fourth semiconductor material and second compound semiconductor structures 2220 of a fifth semiconductor material. The fourth semiconductor material is different from the fifth semiconductor material. In this example it is assumed that the fifth semiconductor material is the same material as the third semiconductor material of the second matching structure 151, but according to other embodiments the semiconductor materials of the second matching structure 151 and the second compound semiconductor structures 2220 may be different. The first compound semiconductor structures 2210 provide a seed surface for the second compound semiconductor structures 2220 and the second compound semiconductor structures 2220 provide a seed surface for the first compound semiconductor structures 2210.

Figure 23:
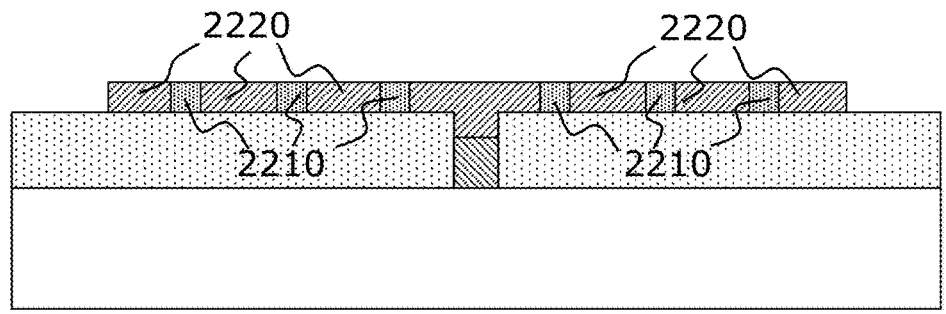
FIG. 23 shows a cross-sectional view the structure of FIG. 22 after removal of the cavity structure.

FIG. 23 shows a cross-sectional view of a structure 2300 after removal of the cavity structure.

Figure 24:
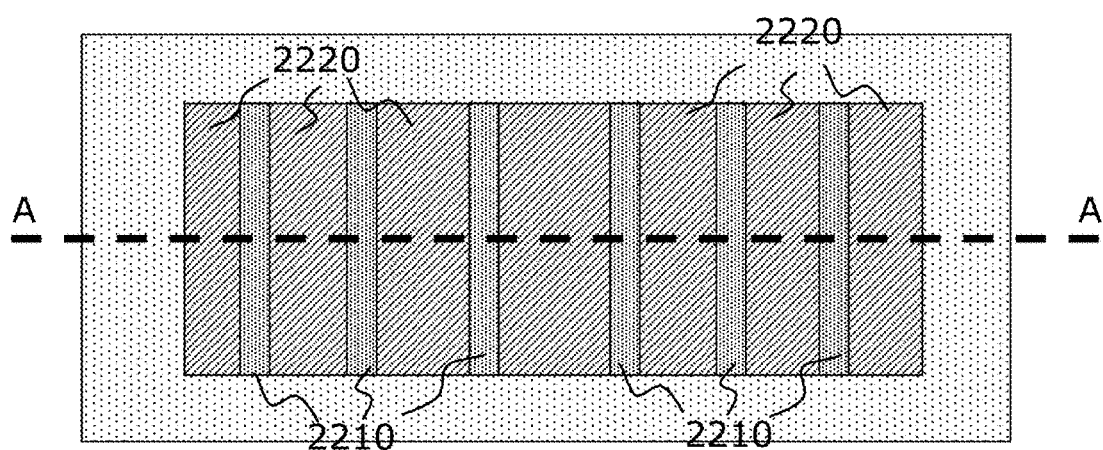
FIG. 24 shows a corresponding top view of the structure of FIG. 23.

FIG. 24 shows a corresponding top view of the structure 2300. More particularly, the structure 2300 is a cross section taken along the line A-A of FIG. 24.

FIG. 25 shows a cross-sectional view of a structure 2500 after selectively etching the second compound semiconductor structures 2220. This has formed a fin structure 2510 comprising a plurality of parallel fins 2520 of the first compound semiconductor structures 2210.

FIG. 26 shows a corresponding top view of the structure 2500. More particularly, the structure 2500 is a cross section taken along the line A-A of FIG. 26.

The fin structure 2510 may be e.g. used to fabricate FIN FETs.

The width $w_1$ of the first compound semiconductor structures 2210 in the growth direction x (corresponding to the fins 2520) and the width $w_2$ of the second compound semiconductor structures 2220 in the growth direction x can be controlled via the time of the epitaxial growth.

The fourth and/or the fifth semiconductor materials of the compound semiconductor structures may be generally any material suitable for epitaxial growth. According to preferred embodiments the fourth and/or fifth semiconductor materials may be a group III-V compound semiconductor material. The group III-V material could be a binary material such, as for example, Gallium Arsenide (GaAs) or Gallium Antimonide (GaSb). The group III-V material could also be a tertiary material such as, for example, Indium Gallium Arsenide (InGaAs) or Indium Gallium Antimonide (InGaSb). According to other embodiments group II-VI semiconductor compounds, mixed II-VI compounds, and IV-VI compounds may be used. According to another preferred embodiment $In_xGa_{1-x}As$ where x=0 to 1 may be used. According to other embodiments further alloyed combinations of (In, Ga) and (As, Sb, P) may be used. Further examples include gallium aluminum arsenide (GaAlAs), indium phosphide (InP), cadmium sulfide (CdS), cadmium mercury telluride (CdHgTe), zinc selenide (ZnSe), zinc sulfur selenide (ZnSSe), lead selenide (PbSe), lead telluride (PbTe), lead sulfide selenide (PbSSe) and the like.

According to embodiments the fourth and the fifth semiconductor material are chosen to be such to have a good etching selectivity to facilitate an efficient and reliable etching of the second compound semiconductor structures 2220. According to embodiments the first compound semiconductor structures 2210 comprises InGaAs as fourth semiconductor material and the second compound semiconductor structures 2220 comprise InP as fifth semiconductor material.

While illustrative examples are given above, it will be appreciated that the basic fabrication steps described above can be used to produce semiconductor structures of other materials, shapes and sizes. Materials and processing techniques can be selected as appropriate for a given embodiment, and suitable choices will be readily apparent to those skilled in the art.

While particular examples have been described above, numerous other embodiments can be envisaged. The seed surfaces for growing the semiconductor structures may be preferably crystalline seed surfaces, but may according to other embodiments also be provided by amorphous surfaces. If the seed has a well-defined crystalline orientation and if the crystal structure of the seed is a reasonable match to that of the growing crystal (for example a III-V compound semiconductor), the growing crystal can adapt this orientation. If the seed is amorphous or has an undefined crystal orientation, the growing crystal will be single crystalline but its crystal orientation will be random.

By appropriate shaping of the sacrificial structure in fabrication processes embodying the invention, cavity structures and corresponding cavities can be formed with any desired shapes and cross-sectional dimensions. Furthermore, the cross-section may be varied along the length of the cavity structures if desired. For example, cavity structures can be formed with curves, bends, corners, junctions and branches.

The disclosed semiconductor structures and circuits can be part of a semiconductor chip. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip may be integrated with other chips, discrete circuit elements, and/or other signal processing devices as part of either an intermediate product, such as a motherboard, or an end product. The end product can be any product that includes integrated circuit chips, ranging from toys and other low-end applications to advanced computer products having a display, a keyboard or other input devices, and a central processor.

Embodiments of the present invention described and illustrated herein have been dedicated to use in semiconductor devices such as integrated circuits. However, embodiments of the present invention are not limited as such. Other embodiments of the present invention contemplate a temperature measurement device that could be a "standalone" device, such as one that is placed on the skin of a human and used to take temperature measurements of the human. As such, this type of device may be a relatively inexpensive and high volume type of device which is used once and then discarded. Also, other embodiments of the present invention contemplate a temperature measurement device that may be integrated into a process control system for various types of industry, for example, some type of manufacturing process in which it is desired to measure the temperature of a part being manufactured and/or of the machines utilized in the manufacture of the parts.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e., occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for fabricating a compound semiconductor structure, the method comprising:
   providing a semiconductor substrate comprising a first semiconductor material;
   forming an insulating layer on the semiconductor substrate;
   forming an opening in the insulating layer, thereby exposing a seed surface of the substrate, the opening having sidewalls and a bottom, wherein the bottom corresponds to the seed surface of the substrate;
   forming a cavity structure above the insulating layer, the cavity structure comprising the opening and a lateral growth channel extending laterally over the substrate;
   growing a matching array on the seed surface of the substrate, the matching array comprising at least a first matching structure comprising a second semiconductor material and a second matching structure comprising a third semiconductor material;
   growing the compound semiconductor structure comprising a fourth semiconductor material on a seed surface of the matching array;
   wherein the first, the second, the third and the fourth semiconductor material are different from each other;
   further comprising providing a geometrical constraint in the growth channel to reduce in plane crystalline defects, wherein the geometrical constraint is an in-plane necking of the growth channel in a plane of a top view of the semiconductor structure.

2. A method for fabricating a compound semiconductor structure, the method comprising:
   providing a semiconductor substrate comprising a first semiconductor material;
   forming an insulating layer on the semiconductor substrate;
   forming an opening in the insulating layer, thereby exposing a seed surface of the substrate, the opening having sidewalls and a bottom, wherein the bottom corresponds to the seed surface of the substrate;
   forming a cavity structure above the insulating layer, the cavity structure comprising the opening and a lateral growth channel extending laterally over the substrate;
   growing a matching array on the seed surface of the substrate, the matching array comprising at least a first matching structure comprising a second semiconductor material and a second matching structure comprising a third semiconductor material;
   growing the compound semiconductor structure comprising a fourth semiconductor material on a seed surface of the matching array;
   wherein the first, the second, the third and the fourth semiconductor material are different from each other;
   further comprising providing a geometrical constraint in the growth channel to reduce in plane crystalline defects, wherein the geometrical constraint is a change of the in-plane direction of the growth channel in a plane of a top view of the semiconductor structure.

* * * * *